US012612330B2

(12) United States Patent
Wu et al.

(10) Patent No.: US 12,612,330 B2
(45) Date of Patent: Apr. 28, 2026

(54) GLASS BUBBLES AND ARTICLES THEREFROM

(71) Applicant: 3M INNOVATIVE PROPERTIES COMPANY, St. Paul, MN (US)

(72) Inventors: Yong K. Wu, Woodbury, MN (US); Mulugeta D. Dejene, Columbia Heights, MN (US); Andrew S. D'Souza, Shoreview, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 186 days.

(21) Appl. No.: 18/576,126

(22) PCT Filed: Jul. 6, 2022

(86) PCT No.: PCT/IB2022/056254
§ 371 (c)(1),
(2) Date: Jan. 3, 2024

(87) PCT Pub. No.: WO2023/285925
PCT Pub. Date: Jan. 19, 2023

(65) Prior Publication Data
US 2024/0327270 A1 Oct. 3, 2024

Related U.S. Application Data

(60) Provisional application No. 63/222,853, filed on Jul. 16, 2021.

(51) Int. Cl.
| | |
|---|---|
| *C03C 11/00* | (2006.01) |
| *B32B 15/08* | (2006.01) |
| *B32B 15/20* | (2006.01) |
| *B32B 27/20* | (2006.01) |
| *C03C 25/1095* | (2018.01) |
| *C03C 25/47* | (2018.01) |
| *C08J 5/18* | (2006.01) |
| *C08J 5/24* | (2006.01) |
| *C08K 7/28* | (2006.01) |
| *H05K 1/03* | (2006.01) |

(52) U.S. Cl.
CPC ........... *C03C 11/002* (2013.01); *B32B 15/08* (2013.01); *B32B 15/20* (2013.01); *B32B 27/205* (2013.01); *C03C 25/1095* (2013.01); *C03C 25/47* (2018.01); *C08J 5/18* (2013.01); *C08J 5/244* (2021.05); *C08J 5/249* (2021.05); *C08K 7/28* (2013.01); *H05K 1/032* (2013.01); *B32B 2264/101* (2013.01); *B32B 2264/2032* (2020.08); *B32B 2264/303* (2020.08); *B32B 2307/204* (2013.01); *B32B 2457/08* (2013.01); *C08K 2201/005* (2013.01); *H05K 2201/0129* (2013.01)

(58) Field of Classification Search
CPC ........... H05K 2201/0129; H05K 1/032; C08K 2201/005; C08K 7/28; C08J 5/18; C08J 5/249; C08J 5/244; C03C 3/089; C03C 25/1095; C03C 25/47; C03C 11/002; B32B 27/205; B32B 15/08; B32B 15/20; B32B 2307/204; B32B 2457/08; B32B 2264/303; B32B 2264/2032; B32B 2264/101; C03B 19/107
USPC ........................................................ 442/180
See application file for complete search history.

(56) References Cited

U.S. PATENT DOCUMENTS

| | | | |
|---|---|---|---|
| 2,978,340 | A | 4/1961 | Franklin et al. |
| 3,030,215 | A | 4/1962 | Franklin et al. |
| 3,129,086 | A | 4/1964 | Franklin et al. |
| 3,230,064 | A | 1/1966 | Franklin et al. |
| 3,365,315 | A | 1/1968 | Beck et al. |
| 4,391,646 | A | 7/1983 | Howell |
| 4,767,726 | A | 8/1988 | Marshall |
| 5,176,732 | A | 1/1993 | Block et al. |
| 5,279,895 | A | 1/1994 | Ogasawara et al. |
| 5,354,611 | A | 10/1994 | Arthur et al. |
| 5,785,789 | A | 7/1998 | Gagnon et al. |
| 7,816,428 | B2 | 10/2010 | Sasaki et al. |
| 9,006,302 | B2 | 4/2015 | Amos et al. |
| 9,258,892 | B2 | 2/2016 | Crosley |
| 11,053,352 | B2 | 7/2021 | Chen et al. |
| 11,261,305 | B2 | 3/2022 | Chen et al. |
| 2002/0004111 | A1 | 1/2002 | Matsubara et al. |

(Continued)

FOREIGN PATENT DOCUMENTS

| | | |
|---|---|---|
| CN | 102625574 B | 8/2014 |
| CN | 102583973 B | 1/2016 |
| CN | 103304955 B | 4/2017 |

(Continued)

OTHER PUBLICATIONS

Brochure: "3M™ Glass Bubbles", 2018, 98-0212-4254-4 Revision B, 12 pages.

(Continued)

*Primary Examiner* — Camie S Thompson

(74) *Attorney, Agent, or Firm* — Carlos M. Téllez Rodriguez; 3M Innovative Properties Co

(57) ABSTRACT

A plurality of glass bubbles having, in combination, a D50 size of no greater than 13 micrometers, an average true density of no greater than 0.42 grams per cubic centimeter, and a 90% crush strength of at least 55 megapascals are described. Methods of making such glass bubbles and compositions and articles such as sheet molding compounds and dielectric layers prepared from such glass bubbles are also described.

20 Claims, No Drawings

(56) References Cited

U.S. PATENT DOCUMENTS

| | | |
|---|---|---|
| 2006/0122049 A1 | 6/2006 | Marshall et al. |
| 2014/0088244 A1* | 3/2014 | Takeishi .................. C08L 23/10 524/584 |

FOREIGN PATENT DOCUMENTS

| | | |
|---|---|---|
| CN | 109836631 A | 6/2019 |
| CN | 110317445 A | 10/2019 |
| CN | 109852031 B | 7/2021 |
| DE | 3711238 A1 | 10/1987 |
| EP | 0234896 A2 | 9/1987 |
| EP | 0304699 A2 | 3/1989 |
| EP | 0382557 A1 | 8/1990 |
| EP | 0440918 A2 | 8/1991 |
| EP | 0450773 A2 | 10/1991 |
| EP | 0513643 A1 | 11/1992 |
| EP | 0492154 B1 | 8/1997 |
| EP | 0393625 B2 | 11/1999 |
| EP | 1172341 A1 | 1/2002 |
| EP | 1527121 B1 | 6/2006 |
| EP | 3025566 B1 | 4/2021 |
| EP | 3689969 B1 | 6/2021 |
| FR | 2725195 A1 | 4/1996 |
| JP | H03-237075 A | 10/1991 |
| JP | H04-268340 A | 9/1992 |
| JP | H08-213762 A | 8/1996 |
| JP | 2553250 B2 | 11/1996 |
| JP | 2001123011 A | 5/2001 |
| JP | 2002338280 A | 11/2002 |
| WO | 2007058812 A1 | 5/2007 |
| WO | 2008052154 A2 | 5/2008 |
| WO | 2020237416 A1 | 12/2020 |
| WO | WO-2021074146 A1* | 4/2021 .............. C08L 67/02 |

OTHER PUBLICATIONS

Hollowlite, "Product Name: Hollow Glass Sphere", (Date unknown but believed to be prior to the date of the filing of the present application.), URL <https://en.hollowlite.com/products/Hollow-Glass-Sphere.html>, 4 pages.
International Search Report for PCT Application No. PCT/IB2022/056254, mailed on Oct. 5, 2022, 4 pages.
Krenzke, "The Elastic Buckling Strength of Spherical Glass Shells", Sep. 1963, Structural Mechanics Laboratory Research and Development Report, Report 1759, 30 pages.
Brochure: "3M™ Glass Bubbles K42HS", 2017, 98-0212-4176-9 Revision B, 2 pages.

* cited by examiner

GLASS BUBBLES AND ARTICLES THEREFROM

CROSS REFERENCE TO RELATED APPLICATIONS

This application is a national stage filing under 35 U.S.C. 371 of PCT/IB2022/056254, filed 6 Jul. 2022, which claims the benefit of U.S. Application No. 63/222,853, filed 16 Jul. 2021, the disclosure of which is incorporated by reference in its/their entirety herein.

FIELD

The present disclosure relates to small glass bubbles with high strength and low density. Polymer composites containing such glass bubbles and articles containing such glass bubbles such as sheet molding compounds and copper clad laminates are also described.

SUMMARY

Briefly, in one aspect, the present disclosure provides a plurality of glass bubbles having, in combination, a D50 of no greater than 13 micrometers, an average true density of no greater than 0.42 grams per cubic centimeter; and a 90% crush strength of at least 55 megapascals.

In another aspect, the present disclosure provides compositions comprising such glass bubbles dispersed in a polymer, and articles prepared form such compositions including sheet molding compounds and dielectric layers.

The above summary of the present disclosure is not intended to describe each embodiment of the present invention. The details of one or more embodiments of the invention are also set forth in the description below. Other features, objects, and advantages of the invention will be apparent from the description and from the claims.

DETAILED DESCRIPTION

Glass bubbles having an average diameter of less than about 500 micrometers, also commonly known as "glass microbubbles", "hollow glass microspheres" or "hollow glass beads" are widely used in industry, for example, as additives to polymeric compounds. In many industries, glass bubbles are useful, for example, for lowering weight and improving processing, dimensional stability and flow properties of a polymeric compound. Generally, it is desirable that the glass bubbles be strong to avoid being crushed or broken during processing of the polymeric compound, such as by high pressure spraying, kneading, extrusion, pultrusion, sintering, or molding (e.g., compression molding, injection molding, blow molding, roto-molding, thermoforming, and injection-compression molding).

In various applications, there is a continued need for smaller, lower density glass bubbles. For example, the development of 5G communication technology will enable a new general-purpose technology revolution. The key to the success of the 5G and future generations of communication technologies relies on the use of low dielectric materials, which enhance the signal transmission speed and reduce signal loss and passive intermodulation (PIM) at high frequencies.

Glass bubbles, being vastly hollow inside, have very low dielectric properties, especially dielectric constant. Their dielectric constants are lower than the lowest dielectric constant polymer materials, such as PTFE. Therefore, they have been recognized as low dielectric fillers for making high frequency copper clad laminate, CCL, which is the board for making a PCB. However, CCL used for high speed switch boards require an ultra-low dielectric loss factor that calls for further improvement of the loss factor from the current glass bubbles.

Most hand-held devices utilize high density interconnector (HDI) PCB and flexible PCB. HDI PCB requires smaller size glass bubbles, since the soldering holes are very close to each other. If the size of glass bubbles is too large, two neighbor holes could punch through a single bubble and create a shorted circuit. Flexible CCL, on other hand, tends to be thin, from above 10 μm to less than 100 μm thick. Large size glass bubbles can lead to rough surfaces, which increase the signal loss and PIM. Thus, small size glass bubbles with low dielectric loss factors are much needed in the market for 5G and other electronic applications.

In another application, glass bubbles have been added to resins to reduce the weight of sheet molding compounds and bulk molding compounds. Lower density bubbles would further reduce weight, but smaller bubbles are also desired to maintain high gloss surface finishes needed in applications such as automotive and recreational vehicles.

In addition to smaller size and lower density, these and other applications also benefit from higher strength bubbles. Generally, the bubbles should have a crush strength great enough to survive handle, processing (e.g., compounding with resins or other materials and molding), and in-use forces.

Despite the need for glass bubbles having smaller sizes, lower densities, and high strength, these properties cannot be independently selected. Instead, there are well-known trade-offs between size, density and strength. For example, the theoretical collapse strength (TCS) of an individual glass bubble (or a monodisperse sample of glass bubbles) has been given by the following formula (I) devised by M. A. Krenzke and R. M. Charles ("Elastic Buckling Strength of Spherical Glass Shells," David Taylor Model Basin Report No. 1759 September, 1963), $$TCS = \frac{0.8E(h/r)^2}{\sqrt{1-V^2}} \tag{I}$$

where "E" is Young's modulus for the glass of the bubbles, "h" is the thickness of the wall of the bubbles, "r" is the radius of the bubble, and "V" is Poisson's ratio for the glass. The equation suggests that the two factors, among others, that influence the approximate theoretical strength of a spherical glass bubble are wall thickness (h) and the average radius (r).

The theoretical density of a hollow glass bubble is also a function of both wall thickness (h) and the average radius (r). Assuming the density of the air or other gas in the hollow center of the bubble is negligible compared to the density of the glass, the ratio of the bubble density (Db) over the glass density (Dg) is given by the following formula (II):

$$\frac{Db}{Dg} = 1 - \left(1 - \frac{h}{r}\right)^3 \tag{II}$$

Referring to Formula (I), for a given glass formulation and bubble forming process, smaller bubbles (lower r) and thicker walls (greater h) are required to achieve a higher theoretical crush strength. However, referring to Formula (II), larger bubbles (greater r) and thinner walls (lower h) are required to achieve a lower density. These trade-offs in size, density and strength are reflected in the properties of commercially available glass bubbles and in the experimental results reported in the prior art. Some of these data are summarized in Table 2, with the sources of the data summarized in Table 1.

TABLE 1

Sources of glass bubble property data.

| Source I.D. | Reference |
|---|---|
| A | 3M Glass Bubbles Brochure (98-0212-4254-4 Rev. B) |
| B | http://en.hollowlite.com/products/Hollo-Glass-Sphere.html |
| C | Chinese Patent Number: CN 102583973B |
| D | Chinese Patent Number: CN 103304955B |
| E | European Patent Number: EP 1945709 |
| F | U.S. Pat. No.: U.S. Pat. No. 9,006,302 |

As discussed in more detail below, in Table 2, (i) D50 refers to the size (i.e., diameter) where 50 percent by volume of the glass bubbles in the distribution are smaller than the indicated size;

(ii) Density refers to the average true density; and (iii) 90% crush strength is the hydrostatic pressure at which 90% by volume of the glass bubbles survive; i.e., the hydrostatic pressure at which ten percent by volume of the glass bubbles collapse.

TABLE 2

Reported glass bubble property data.

| Source | I.D. | D50 (microns) | Density (g/cc) | 90% Crush strength (MPa) |
|---|---|---|---|---|
| A | S38XHS | 35 | 0.38 | 38 |
| A | S28HS | 30 | 0.28 | 21 |
| A | S60HS | 30 | 0.60 | 124 |
| A | S2HS | 25 | 0.32 | 41 |
| A | K42HS | 22 | 0.42 | 52 |
| A | S2XHS | 22 | 0.42 | 55 |
| A | iM16K | 20 | 0.46 | 110 |
| A | iM30K | 18 | 0.60 | 186 |
| B | HS20 | 60 | 0.20 | 7 |
| B | HS22 | 45 | 0.21 | 8 |
| B | HS38 | 30 | 0.37 | 38 |
| B | HS42 | 25 | 0.40 | 55 |
| B | HS46 | 20 | 0.44 | 110 |
| B | HS60 | 16 | 0.58 | 193 |
| B | HS65 | 13 | 0.63 | 207 |
| B | HS70 | 10 | 0.68 | 207 |
| C | EX7 | 50 | 0.25 | 2 |
| C | EX6 | 40 | 0.30 | 9 |
| C | EX8 | 40 | 0.25 | 2 |
| C | EX9 | 40 | 0.35 | 6 |
| C | EX20 | 40 | 0.25 | 3 |
| C | EX1 | 38 | 0.55 | 42 |
| C | EX5 | 38 | 0.40 | 25 |
| C | EX12 | 38 | 0.50 | 40 |
| C | EX14 | 38 | 0.35 | 15 |
| C | EX21 | 35 | 0.45 | 45 |
| C | EX3 | 35 | 0.50 | 33 |
| C | EX4 | 35 | 0.30 | 5 |
| C | EX10 | 35 | 0.40 | 16 |
| C | EX11 | 35 | 0.30 | 8 |
| C | EX13 | 35 | 0.35 | 15 |
| C | EX15 | 35 | 0.46 | 40 |
| C | EX16 | 35 | 0.46 | 43 |
| C | EX17 | 35 | 0.46 | 40 |
| C | EX18 | 35 | 0.45 | 28 |
| C | EX19 | 35 | 0.35 | 8 |
| C | EX2 | 30 | 0.60 | 50 |

4

TABLE 2-continued

Reported glass bubble property data.

| Source | I.D. | D50 (microns) | Density (g/cc) | 90% Crush strength (MPa) |
|---|---|---|---|---|
| C | EX22 | 30 | 0.55 | 50 |
| D | EX3 | 50 | 0.50 | 70 |
| D | EX1 | 30 | 0.60 | 100 |
| D | EX2 | 5 | 1.00 | 130 |
| D | EX4 | 5 | 1.00 | 130 |
| E | EX1 | 22 | 0.62 | 131 |
| E | EX2 | 18 | 0.92 | 200 |
| F | EX3 | 30 | 0.34 | 79 |
| F | EX2 | 21 | 0.42 | 116 |
| F | EX1 | 17 | 0.53 | 200 |

As show in Table 2, within each data source and across all sources, the general trend of increasing strength with a reduction in bubble size, is counter balanced by the increase in density.

Co-assigned U.S. Pat. No. 9,006,302 B2 ("Glass Bubbles, Composites Therefrom, and Method of Making Glass Bubbles", Amos et al., granted 14 Apr. 2015) describes a first plurality of glass bubbles having unexpectedly high strength for their density and size. The glass bubbles have an average true density of up to 0.55 g/cc, a D50 size of 15 to 40 micrometers, and a 90% crush strength of at least 100 MPa. In some embodiments, this first plurality of glass bubbles is a graded fraction preparable by classifying a second plurality of glass bubbles, wherein the second plurality of glass bubbles has a higher number of glass bubbles with a size up to 10 micrometers than the first plurality of glass bubbles. The results obtained in the examples of U.S. Pat. No. 9,006,302 B2 are shown in Table 2 (Reference F).

Despite this advance, there is still a need for smaller, lower density glass bubbles that retain sufficient crush strength to be used in applications such as sheet molding compounds and copper clad laminates. The present inventors have discovered that, by controlling the particle feed size and size distribution, along with the relative amount of the blowing agent, a plurality of glass bubbles can be produced having a significantly lower density than bubbles of comparable size, while maintaining or increasing their strength relative to larger glass bubbles of similar density.

Generally, the plurality of glass bubbles of the present disclosure has, in combination, (i) a D50 of no greater than 13 microns;

(ii) an average true density of no greater than 0.42 grams per cubic centimeter, and (iii) a hydrostatic pressure at which ten percent by volume of the glass bubbles collapse (i.e., a 90% crush strength) of at least 55 megapascals.

The term D50 is sometimes referred to as the median size. As used herein, D50 refers to the size (i.e., diameter) where 50 percent by volume of the glass bubbles in the distribution are smaller than the indicated size. In some embodiments, D50 is no greater than 12, e.g., no greater than 11 microns. In some embodiments, D50 is at least 10 microns. In some embodiments, D50 is from 9 to 13, e.g., 9 to 12, 9 to 11 microns; e.g., 10 to 13, or even 10 to 12 microns.

In some embodiments, it can be desirable to minimize the number of oversized bubbles. As used herein, D95 refers to the size (i.e., diameter) where 95 percent by volume of the glass bubbles in the distribution are smaller than the indicated size. In some embodiments, D95 is no greater than 24, e.g., no greater than 22, or even no greater than 20 micrometers. In some embodiments, D95 is from 15 to 24, e.g., 15 to 22, or even 15 to 20 microns; e.g., 16 to 24, 16 to 22 or even 16 to 20 microns.

The term "average true density" is the quotient obtained by dividing the mass of a sample of glass bubbles by the true volume of that mass of glass bubbles as measured by a gas pycnometer. The "true volume" is the aggregate total volume of the glass bubbles, not the bulk volume. In some embodiments, the average true density is no greater than 0.40, or even no greater than 0.38 grams per cubic centimeter ("g/cc"). In some embodiments, the average true density is at least 0.32, or even at least 0.35 g/cc. In some embodiments, the average true density is from 0.32 to 0.42 g/cc, e.g., from 0.32 to 0.40, or even from 0.35 to 0.40 grams per cubic centimeter.

The hydrostatic pressure at which ten percent by volume of the glass bubbles collapse is sometimes referred to as the 90% crush strength, i.e., the hydrostatic pressure at which 90% by volume of the glass bubbles survive. In some embodiments, the 90% crush strength is at least 60 megapascals ("MPa"), e.g., at least 70 MPa. In some embodiments, the 90% crush strength is no greater than 110, e.g., no greater than 100 MPa. In some embodiments, the 90% crush strength is 55 to 110, e.g., 60 to 100, or even 70 to 100 MPa.

In some embodiments, the plurality of glass bubbles of the present disclosure has, in combination, (i) a D50 of 9-13, e.g., 9-12 or even 9-11 microns;

(ii) an average true density of 0.32 to 0.42, e.g., 0.32 to 0.40, or even 0.35 to 0.40 g/cc;

(iii) a 90% crush strength of at least 55, e.g., at least 60, or even at least 70 MPa; and optionally, no greater than 110, or even no greater than 100 MPa.

In some embodiments, in combination with the features above, the plurality of glass bubbles of the present disclosure has a D95 of 15 to 24, e.g., 16 to 22 or even 16 to 20 microns.

As measured, the properties of D50, D95, average true density and 90% Crush Strength are average values based on the glass bubbles tested. As used herein, a "plurality of glass bubbles" having a specific property in a specified range, does not refer to a portion of a larger collection of glass bubbles having bulk properties outside the specified range. Instead, the specified properties of the "plurality of bubbles" are the bulk properties of those bubbles, even if the measured values are based on a randomly selected sample from the plurality of bubbles.

Glass bubbles according to and/or useful for practicing the present disclosure can be made by techniques known in the art (sec. e.g., U. S. Pat. No. 2,978,340 (Veatch et al.); U.S. Pat. No. 3,030,215 (Veatch et al.); U.S. Pat. No. 3,129,086 (Veatch et al.); and U.S. Pat. No. 3,230,064 (Veatch et al.); U.S. Pat. No. 3,365,315 (Beck et al.); U.S. Pat. No. 4,391,646 (Howell); and U.S. Pat. No. 4,767,726 (Marshall); and U. S. Pat. App. Pub. No. 2006/0122049 (Marshall et. al). Techniques for preparing glass bubbles typically include heating milled frit, commonly referred to as "feed", which contains a blowing agent (e.g., sulfur or a compound of oxygen and sulfur). The resultant product (that is, "raw product") obtained from the heating step typically contains a mixture of glass bubbles, broken glass bubbles, and solid glass beads, the solid glass beads generally resulting from milled frit particles that failed to form glass bubbles for whatever reason. This raw product can be filtered, screened, floated or otherwise processed to remove broken glass bubbles and solid glass beads, retaining the desired glass bubbles.

Although the frit and/or the feed may have any composition that is capable of forming a glass, typically, on a total weight basis, the frit comprises from 50 to 90 percent of $SiO_2$, from 2 to 20 percent of alkali metal oxide (e.g., $Li_2O$, $Na_2O$, $K_2O$), from 1 to 30 percent of $B_2O_3$, from 0.005-0.5 percent of sulfur (for example, elemental sulfur, sulfate or sulfite can serve as sulfur sources), from 0 to 25 percent divalent metal oxides (for example, CaO, MgO, BaO, SrO, ZnO, or PbO), from 0 to 10 percent of tetravalent metal oxides other than $SiO_2$ (for example, $TiO_2$, $MnO_2$, or $ZrO_2$), from 0 to 20 percent of trivalent metal oxides (for example, $Al_2O_3$, $Fe_2O_3$, or $Sb_2O_3$), from 0 to 10 percent of oxides of pentavalent atoms (for example, $P_2O_5$ or $V_2O_5$), and from 0 to 5 percent fluorine (as fluoride) which may act as a fluxing agent to facilitate melting of the glass composition. Additional ingredients are useful in frit compositions and can be included in the frit, for example, to contribute particular properties or characteristics (for example, hardness or color) to the resultant glass bubbles.

In some embodiments, the first plurality of glass bubbles according to the present disclosure has a glass composition comprising more alkaline earth metal oxide than alkali metal oxide. In some of these embodiments, the weight ratio of alkaline earth metal oxide to alkali metal oxide is in a range from 1.2:1 to 3:1. In some embodiments, the first plurality of glass bubbles according to the present disclosure has a glass composition comprising $B_2O_3$ in a range from 2 percent to 6 percent based on the total weight of the glass bubbles. In some embodiments, the glass bubbles have a glass composition comprising up to 5 percent by weight $Al_2O_3$, based on the total weight of the glass bubbles. In some embodiments, the glass composition is essentially free of $Al_2O_3$. "Essentially free of $Al_2O_3$" may mean up to 5, 4, 3, 2, 1, 0.75, 0.5, 0.25, or 0.1 percent by weight $Al_2O_3$. Glass compositions that are "essentially free of $Al_2O_3$" also include glass compositions having no $Al_2O_3$. Glass bubbles according to the present disclosure may have, in some embodiments, a chemical composition wherein at least 90%, 94%, or even at least 97% of the glass comprises at least 67% $SiO_2$. (e.g., a range of 70% to 80% $SiO_2$), a range of 8% to 15% of an alkaline earth metal oxide (e.g., CaO), a range of 3% to 8% of an alkali metal oxide (e.g., $Na_2O$), a range of 2% to 6% B2O3, and a range of 0.125% to 1.5% $SO_3$.

The milled frit typically has range of particle sizes that influences the size distribution of the raw product, including the formed glass bubbles. During heating, the larger particles tend to form glass bubbles that are more fragile than the mean, while the smaller particles tend to increase the density of the glass bubble distribution. When preparing glass bubbles by milling frit and heating the resulting particles, the amount of sulfur in the glass particles (i.e., feed) and the amount and length of heating to which the particles are exposed (e.g., the rate at which particles are fed through a flame) can typically be adjusted to adjust the density of the glass bubbles.

Lower amounts of sulfur in the feed and faster heating rates lead to higher density bubbles as described in U.S. Pat. No. 4,391,646 (Howell) and U.S. Pat. No. 4,767,726 (Marshall). Furthermore, milling the frit to smaller sizes has been used to form to smaller, but higher density glass bubbles. Surprisingly, the present inventors discovered that by controlling the feed particle size and size distribution, as well as the blowing agent (e.g., sulfur) content, glass bubbles having, in combination, smaller sizes, lower densities and higher strengths than prior art bubbles could be produced. Glass bubbles having this new combination of properties provide a new design space for applications such a polymer composites and copper clad laminates and overcome some of the undesirable trade-offs required by existing glass bubbles.

The present disclosure also provides composites comprising a polymer and a first plurality of glass bubbles according to and/or prepared according to the present disclosure. The polymer may be a thermoplastic or a thermoset polymer, and the composite may contain a mixture of polymers. Suitable polymers for the composite may be selected by those skilled in the art, depending at least partially on the desired application. In some embodiments, the composite material may be used as a sheet molding compound or as a dielectric layer.

In some embodiments, the polymer in the composite disclosed herein is a thermoplastic. Exemplary thermoplastics include polyolefins (e.g., polypropylene, polyethylene, and polyolefin copolymers such as ethylene-butene, ethylene-octene, and ethylene vinyl alcohol); cyclo-olefin polymers (COP); cyclo-olefin copolymers (COC); fluorinated polyolefins (e.g., polytetrafluoroethylene, copolymers of tetrafluoroethylene and hexafluoropropylene (FEP), perfluoroalkoxy polymer resin (PFA), polychlorotrifluoroethylene (pCTFE), copolymers of ethylene and chlorotrifluoroethylene (pECTFE), and copolymers of ethylene and tetrafluoroethylene (PETFE)); polyamide; polyamide-imide; polyether-imide; polyetherketone resins; polystyrenes; polystyrene copolymers (e.g., high impact polystyrene, acrylonitrile butadiene styrene copolymer (ABS)); polyacrylates; polymethacrylates; polyesters; polyvinylchloride (PVC); liquid crystal polymers (LCP); polyphenylene sulfides (PPS); polysulfones; polyacetals; polycarbonates; polyphenylene oxides; and blends of two or more such resins. In some embodiments, the polymer in the composite is a thermoplastic comprising at least one of polypropylene or polyethylene (e.g., high density polyethylene (HDPE), low density polyethylene (LDPE), linear low density polyethylene (LLDPE), polypropylene (PP)), and polyolefin copolymers (e.g., copolymers of propylene and ethylene). In some of these embodiments, the thermoplastic is polypropylene (e.g., high density polyethylene (HDPE), low density polyethylene (LDPE), and linear low density polyethylene (LLDPE)). In some embodiments, the thermoplastic is elastomeric.

In some embodiments, the polymer in the composite disclosed herein is a thermoset. Exemplary thermosets include epoxy, polyester, polyurethane, polyurea, silicone, polysulfide, functional groups capped polyphenylene oxide (PPO), polyphenylene ether (PPE), dicyclopentadiene (DCPD), vinyl ester resins, unsaturated polyesters and phenolic. In some embodiments, the polymer in the composite is a thermoset selected from the group consisting of epoxy, polyurethane, silicone, and polyester. In some embodiments, the thermoset is elastomeric.

In some embodiments, the polymer in the composite disclosed herein is elastomeric. Exemplary useful elastomeric polymers include polybutadiene, polyisobutylene, ethylene-propylene copolymers, ethylene-propylene-diene terpolymers, sulfonated ethylene-propylene-diene terpolymers, polychloroprene, poly(2,3-dimethylbutadiene), poly(butadiene-co-pentadiene), chlorosulfonated polyethylenes, polysulfide elastomers, silicone elastomers, poly(butadiene-co-nitrile), hydrogenated nitrile-butadiene copolymers, acrylic elastomers, ethylene-acrylate copolymers, fluorinated elastomers, fluorochlorinated elastomers, fluorobrominated elastomers and combinations thereof. The elastomeric polymer may be a thermoplastic elastomer. Exemplary useful thermoplastic elastomeric polymer resins include block copolymers, made up of blocks of glassy or crystalline blocks of, for example, polystyrene, poly(vinyltoluene), poly(t-butylstyrene), and polyester, and elastomeric blocks of, for example, polybutadiene, polyisoprene, ethylene-propylene copolymers, ethylene-butylene copolymers, polyether ester, and combinations thereof. Some thermoplastic elastomers are commercially available, for example, poly(styrene-butadiene-styrene) block copolymers marketed by Shell Chemical Company, Houston, Texas, under the trade designation "KRATON".

Additives may be incorporated into the composite according to the present disclosure depending on the application (e.g., preservatives, curatives, mixing agents, colorants, dispersants, glass fibers, mineral fillers, floating or anti-setting agents, flow or processing agents, wetting agents, air separation promoters, functional nanoparticles, and acid/base or water scavengers).

In some embodiments of the composites according to the present disclosure, the glass bubbles may be treated with a coupling agent to enhance the interaction between the glass bubbles and the polymer. It is desirable to select a coupling agent that matches or provides suitable reactivity with corresponding functional groups of the chosen polymer formulation. Illustrative examples of coupling agents include zirconates, silanes, or titanates.

In some embodiments, the composite material may be coated on or infused into a substrate. For example, the small size and low density of the present bubbles combined with their strength make the bubbles of the present disclosure well-suited for use as a sheet molding compound.

Generally, a sheet molding compound (SMC) is a ready to mold fiber-reinforced polymeric material primarily used in compression molding. Glass bubbles of the present disclosure can be incorporated into the polymer and infused into the fiber matrix (e.g., a glass fiber matrix). The low densities of the bubbles can deliver lighter weight articles, which may be desirable in applications such as automotive. The small size of the present bubbles can lead to improved surface quality and finish, as may be needed to achieve a desired Class-A finish. The strength of the bubbles can reduce breakage during the infusion and compression molding operations.

The small size and low density of the present bubbles combined with their strength also make the bubbles of the present disclosure well-suited for use in a dielectric layer. For example, the composite materials may be used to form the dielectric layer of a copper clad laminate.

Generally, a copper clad laminate ("CCL") is a plate-like material that can be made by infusing a reinforcing substrate with a polymer to form a dielectric layer, covering one or both sides with copper foil, and hot pressing the resulting construction. The glass bubbles of the present disclosure can be combined with the polymer used to form the dielectric layer. The low densities of the bubbles provide corresponding low dielectric constants, which can be particularly beneficial in 5G applications. The small sizes make the bubbles compatible with the thin layers typical required for a CCL. The strength of the bubbles can reduce breakage during the infusion and hot pressing operations.

In some embodiments, the first plurality of glass bubbles is present in the polymer composite at a level of up to 60 volume percent without voids or up to 90 volume percent with voids, based on the total volume of the composite. In some embodiments, the first plurality of glass bubbles is present in the composite at a level of up to 55, 50, 45, 40, 35, or 30 percent by volume, based on the total volume of the composite. In some embodiments, the first plurality of glass bubbles is present in the composite at a level of up to 40, 35, 30, 25, 20, or 15 percent by weight, based on the total weight of the composite. For example, the first plurality of glass bubbles may be present in the composite in a range from 5 to 40, 5 to 35, 5 to 30, 5 to 25, 7.5 to 25, or 8 to 25 percent by weight, based on the total weight of the composite.

Examples. The following procedures were used and are also referred to in the claims.

True Density Procedure. The average true density was measured using a pycnometer according to ASTM D2840-69. "Average True Particle Density of Hollow Microspheres". The pycnometer may be obtained, for example, under the trade designation "Accupyc 1330 Pycnometer" from Micromeritics. Norcross, Georgia, Average true density can typically be measured with an accuracy of 0.001 g/cc. Accordingly, each of the reported density values can be ±one percent.

Bubble Size Procedure. The size by volume was determined by laser light diffraction by dispersing the glass bubbles in deaerated deionized water. Laser light diffraction particle size analyzers are available, for example, under the trade designation "MICROTRAC S3500" from Microtrac. Montgomeryville, Pennsylvania, D50 was the size where 50 percent by volume of the glass bubbles in the distribution are smaller than the indicated size. Similarly, D95 was the size where 95 percent by volume of the glass bubbles in the distribution are smaller than the indicated size.

Collapse Strength Procedure. The collapse strength of the glass bubbles is measured on a dispersion of the glass bubbles in glycerol using ASTM D3102-72 "Hydrostatic Collapse Strength of Hollow Glass Microspheres"; with the exception that the sample size (in grams) is equal to 10 times the density of the glass bubbles. Further details are provided in the Examples, below. Collapse strength can typically be measured with an accuracy of ±five percent. Accordingly, each of the collapse strength values provided above can be ±five percent. In Table 4, the hydrostatic pressure at which 10% by volume of the glass bubbles collapsed is reported as the "90% Crush Strength."

Glass compositions. Various glass compositions were prepared from a glass frit comprising 1000 g of ground silica (obtained from US Silica, West Virginia, USA), 235 g of dehydrated borax (obtained from US Borax, California, USA), 333 g of calcium carbonate (obtained from Imerys, Alabama, USA), 58 g of sodium carbonate (obtained from FMC Corp., Wyoming, USA), and 21 g of tetrasodium polyphosphate (obtained from Astaris, Missouri, USA). The samples contained various amounts of sodium sulfate as the blowing agent, as summarized in Table 3.

The frit was milled to control the mean feed particle size, using a two-stage, jet milling process. The particle size of the feed was measured using a COULTER COUNTER LS-130" from Beckman Coulter, Fullerton, Calif. The D5, D50 and D95 sizes of the feed are reported in Table 3. Samples of the milled glass frit were then formed into glass bubbles using the process described in U.S. Pat. No. 4,767, 726 (Marshall). The feed prepared above was passed through a natural gas/air flame at various stoichiometric proportions with a total combustion air flow calculated to be about 350 liters/minute at standard temperature and pressure and an output rate of approximately 0.9-2.4 kg/hr. The flame-formed product was cooled by mixing with ambient temperature air and then separated from the resulting gas stream with a cyclone device. The average true density, D50 and D95 sizes, and the hydrostatic pressure at which ten percent by volume of the glass bubbles collapse (i.e., the 90% crush strength) were measured according to the procedures described above. The results are shown in Table 3.

TABLE 3

| | | | | | | 90% | | |
| Sample I.D. | Sodium Sulfate (g) | Feed D5 (μm) | Feed D50 (μm) | Feed D95 (μm) | Density (g/cc) | Crush Strength (MPa) | Bubble D50 (μm) | Bubble D95 (μm) |
|---|---|---|---|---|---|---|---|---|
| A1 | 10 | 3.5 | 5.8 | 9.6 | 0.62 | >207 | 10.0 | 16.2 |
| B1 | 14 | 3.6 | 7.3 | 11.7 | 0.43 | 107 | 14.2 | 21.8 |
| B2 | 14 | 3.6 | 7.3 | 11.7 | 0.47 | 120 | 14.1 | 21.8 |
| B3 | 14 | 2.7 | 4.7 | 7.4 | 0.53 | 127 | 10.5 | 20.5 |
| C1 | 17 | 3.1 | 5.6 | 8.8 | 0.43 | 104 | 11.3 | 18.1 |
| C2 | 17 | 3.1 | 5.6 | 8.8 | 0.38 | 76 | 12.6 | 19.8 |
| D1 | 18 | 3.6 | 6.0 | 9.3 | 0.41 | 93 | 12.3 | 18.4 |
| D2 | 18 | 3.2 | 5.6 | 8.8 | 0.40 | 72 | 12.4 | 20.7 |
| D3 | 18 | 3.2 | 5.6 | 8.8 | 0.41 | 73 | 12.4 | 20.2 |
| D4 | 18 | 1.7 | 3.4 | 5.1 | 0.58 | 155 | 4.8 | 12.0 |
| E1 | 19 | 3.5 | 5.9 | 9.2 | 0.37 | 62 | 13.5 | 21.5 |
| E2 | 19 | 3.5 | 5.9 | 9.2 | 0.41 | 67 | 13.3 | 20.1 |
| E3 | 19 | 3.5 | 5.9 | 9.2 | 0.36 | 62 | 13.6 | 21.2 |
| F1 | 21 | 2.1 | 4.2 | 6.6 | 0.42 | 44 | 11.9 | 28.8 |

In the following examples, the glass feed (frit) was further classified after milling to control the feed particle size distribution in addition to the D50 particle size. First, the glass frit prepared from the composition of Samples DI to D4 (i.e., 18 grams of sodium sulfate blowing agent) was milled down to a D50 of about 6 micrometers. The milled glass powders were then air-classified using a NETZSCH CFS-10 air classifier. To control the particle size distribution, the milled glass powders were classified twice to scalp off the top size and the bottom size. It was observed that the ability to form lower density small size glass bubbles depends on the relative particle size distribution, RPSD, which is defined as (D95-D5)/D50. The particle size of the feed was measured using a COULTER COUNTER LS-130" from Beckman Coulter, Fullerton, Calif.

It is well known that for an air classifier the classified particle size is roughly proportional to the air flow rate and inversely proportional to the square root of the classifier speed. In the following examples, the air flow rate was fixed at 75 Nm³/hr. The results are shown in Table 4 and compared to the distribution for the unclassified feed, F-0.

TABLE 4

| Milled and classified glass feed (frit). | | | | | | |
|---|---|---|---|---|---|---|
| | Classifier speed (rpm) | | | | | |
| | Scalping | Scalping | Feed size (micrometers) | | | |
| Sample | Top | Bottom | D5 | D50 | D95 | RPSD |
| CF-1 | 10,500 | 17,000 | 2.1 | 4.7 | 9.1 | 1.5 |
| CF-2 | 10,000 | 16,000 | 2.5 | 5.2 | 9.9 | 1.4 |
| CF-3 | 9,000 | 12,000 | 3.4 | 6.3 | 10.9 | 1.2 |
| F-O | none | none | 1.4 | 6.0 | 14.7 | 2.2 |

The feeds prepared above were formed into glass bubbles using the same process as described above. The average true density, D50 and D95 sizes, and the hydrostatic pressure at which ten percent by volume of the glass bubbles collapse (i.e., the 90% crush strength) were measured according to the procedures described above. The results are shown in Table 5.

TABLE 5

| Bubbles formed from classified feed (CF-1 to CF-3) and unclassified fed (F-0). | | | | | | |
|---|---|---|---|---|---|---|
| Sample | | Air-Gas | Density | 90% Crush | D50 | D95 |
| Feed | Bubbles | Ratio | (g/cc) | Strength (MPa) | (μm) | (μm) |
| CF-1 | G1 | 11.4 | 0.40 | 58 | 10.0 | 18.8 |
| | G2 | 11.8 | 0.40 | 56 | 10.0 | 18.3 |
| | G3 | 12.0 | 0.40 | 56 | 9.7 | 17.7 |
| | G4 | 12.3 | 0.41 | 54 | 10.0 | 18.8 |
| CF-2 | H1 | 11.0 | 0.40 | 71 | 10.0 | 17.2 |
| | H2 | 11.4 | 0.39 | 68 | 10.0 | 16.3 |
| | H3 | 12.0 | 0.38 | 62 | 9.9 | 17.0 |
| | H4 | 12.2 | 0.39 | 57 | 10.0 | 17.2 |
| CF-2 | J1 | 9.4 | 0.40 | 76 | 10.6 | 15.2 |
| | J2 | 10.8 | 0.37 | 71 | 11.0 | 16.0 |
| | J3 | 11.2 | 0.36 | 68 | 11.2 | 16.5 |
| | J4 | 12.0 | 0.35 | 57 | 11.0 | 17.1 |
| F-0 | K1 | 9.4 | 0.34 | 28 | 16.6 | 28.2 |
| | K2 | 10.8 | 0.31 | 25 | 16.7 | 29.3 |
| | K3 | 12.0 | 0.30 | 24 | 17.1 | 28.9 |

All glass bubble products, and any particulate materials, have distributions of particle sizes. One could obtain small size glass bubbles by classifying common particle size glass bubbles either through a proper size screen or air classification. For glass bubbles, the smaller particle size fractions will have higher densities. Thus, to obtain a small size glass bubble product with a given density, a much lower density glass bubbles must be used as a starting material. However, the glass bubble crush strength will go down with the density. Therefore, the choice of a starting glass bubble material must balance both density and strength in order to keep the density and strength in the specified values of the expected classified small size glass bubbles after classification.

The following comparative examples illustrate attempts to obtain glass bubbles with average size, D50, less than 13 μm with density of 0.42 g/cc and a 90% crush strength of at least 55 MPa by classification of existing commercial glass bubbles. To achieve the above targets, 3M™ Glass Bubbles S32HS and S28HS were chosen as starting materials. These glass bubbles have a smaller particle size to begin with. They are also among the highest strength-to-density ratio glass bubble products. Both products have much lower densities than 0.4 g/cc as starting materials. The measured properties of S32HS ("GB-32") and S28HS ("GB-28") glass bubbles are in Table 6.

TABLE 6

| Properties of commercially available glass bubbles. | | | | | |
|---|---|---|---|---|---|
| Sample | D5 (microns) | D50 (microns) | D95 (microns) | Density (g/cc) | 90% Crush Strength (MPa) |
| GB-32 | 12.3 | 21.3 | 36.1 | 0.32 | 47 |
| GB-28 | 12.0 | 25.4 | 42.2 | 0.29 | 27 |

To classify the small glass bubbles out of these glass bubbles, a NETZSCH CFS-10 air classifier was used. After classification, the collected small size bubbles were mixed in deionized water at 1:10 to 1:15 glass bubble to water weight ratio. The mixtures were then settled for overnight to separate the sinkers out. The floaters were collected and dried to measure the properties, and they are listed in Table 7, sorted from largest to smallest D50.

TABLE 7

| Properties of classified commercially available glass bubbles. | | | | | | | | |
|---|---|---|---|---|---|---|---|---|
| Source | | Classifier | Air Flow | Bubble Size (μm) | | | Density | Strength |
| Bubbles | Sample | RPM | Nm³/hr | D5 | D50 | D95 | g/cc | MPa |
| GB-32 | CE-1 | 10,000 | 75 | 10.1 | 15.9 | 23.7 | 0.41 | 72 |
| GB-32 | CE-2 | 9,000 | 65 | 10.4 | 15.4 | 22.1 | 0.41 | 75 |
| GB-32 | CE-3 | 10,500 | 75 | 9.9 | 14.6 | 21.2 | 0.43 | 67 |
| GB-32 | CE-4 | 9,000 | 60 | 9.8 | 14.4 | 21.0 | 0.44 | 83 |
| GB-28 | CE-5 | 11,000 | 75 | 10.0 | 14.3 | 21.2 | 0.44 | 46 |
| GB-28 | CE-6 | 11,500 | 75 | 10.0 | 14.1 | 20.7 | 0.41 | 47 |
| GB-32 | CE-7 | 11,000 | 75 | 9.4 | 13.0 | 19.0 | 0.46 | 72 |
| GB-32 | CE-8 | 9,000 | 55 | 8.8 | 12.7 | 19.8 | 0.46 | 76 |
| GB-28 | CE-9 | 11,500 | 75 | 9.2 | 12.7 | 18.8 | 0.44 | 52 |
| GB-32 | CE-10 | 12,000 | 75 | 8.9 | 11.7 | 17.4 | 0.44 | 88 |
| GB-28 | CE-11 | 12,800 | 75 | 8.4 | 11.0 | 16.1 | 0.49 | 44 |
| GB-28 | CE-12 | 12,900 | 75 | 5.5 | 10.4 | 16.8 | 0.61 | 57 |

The procedures recited in the claims refer to the procedures described in the Example section. All ranges cited the present application, including those recited in the claims are inclusive of the end points.

What is claimed is:

1. A plurality of glass bubbles having, in combination,
   (i) a D50 of from 9 to 13 micrometers, as measured according to the Bubble Size Procedure;
   (ii) an average true density of 0.32 to 0.42 grams per cubic centimeter, as measured according to the True Density Procedure; and
   (iii) a 90% crush strength of at least 55 megapascals and no greater than 110 megapascals, as measured according to the Collapse Strength Procedure.

2. The plurality of glass bubbles according to claim 1, wherein D50 is from 9 to 12 micrometers.

3. The plurality of glass bubbles of claim 2, wherein D50 is from 9 to 11 micrometers.

4. The plurality of glass bubbles of claim 1, wherein the average true density is 0.32 to 0.40 grams per cubic centimeter.

5. The plurality of glass bubbles of claim 4, wherein the average true density is from 0.35 to 0.40 grams per cubic centimeter.

6. The plurality of glass bubbles of claim 1, wherein the 90% crush strength is at least 60 megapascals.

7. The plurality of glass bubbles of claim 1, wherein the 90% crush strength is no greater than 100 megapascals.

8. A composition comprising the first plurality of glass bubbles of claim 1 and a polymer.

9. The composition according to claim 8, wherein the composition comprises 5 to 40 percent by weight of the first plurality of glass bubbles, based on the total weight of the glass bubbles and the polymer.

10. The composition according to claim 8, wherein the polymer is thermosetting polymer.

11. The composition according to claim 8, wherein the polymer is selected from the group consisting of unsaturated polyesters, vinyl esters, epoxy resins, and phenolic resins.

12. The composition according to claim 8, wherein the polymer is selected from the group consisting of polyphenylene oxide based resins, polyphenylene ether based resins, polyimide, modified polyimide, liquid crystalline polymers, and fluorinated polymers.

13. The composition according to claim 8, wherein the polymer is a thermoplastic.

14. A composite comprising a fibrous support layer infused with the composition of claim 8.

15. The composite of claim 14, wherein the fibrous support layer comprises glass fibers.

16. A sheet molding compound comprising the composition of claim 8.

17. A dielectric layer comprising the composition of claim 8.

18. A copper clad laminate comprising the dielectric layer of claim 17 bonded to at least one copper layer.

19. A plurality of glass bubbles having in combination,
(i) a D50 of from 9 to 13 micrometers, as measured according to the Bubble Size Procedure;
(ii) an average true density of 0.32 to 0.42 grams per cubic centimeter, as measured according to the True Density Procedure; and
(iii) a 90% crush strength of at least 55 megapascals and no greater than 110 megapascals, as measured according to the Collapse Strength Procedure,
wherein D95 is from 15 to 24 micrometers, as measured according to the Bubble Size Procedure.

20. The plurality of glass bubbles of claim 19, wherein D95 is from 16 to 20 micrometers.

* * * * *